(12) United States Patent
Katrak (10) Patent No.: US 7,242,329 B2
(45) Date of Patent: Jul. 10, 2007

(54) METHOD AND SYSTEM FOR PRIORITIZING DATA VALUES FOR ROBUST DATA REPRESENTATION

(75) Inventor: Kerfegar K. Katrak, Fenton, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 149 days.

(21) Appl. No.: 11/201,863

(22) Filed: Aug. 11, 2005

(65) Prior Publication Data

US 2006/0173942 A1    Aug. 3, 2006

Related U.S. Application Data

(60) Provisional application No. 60/649,851, filed on Feb. 2, 2005.

(51) Int. Cl.
*H03M 7/04* (2006.01)
(52) U.S. Cl. ............... 341/97; 341/98; 341/99; 341/106
(58) Field of Classification Search .......... 341/97, 341/98, 99, 106
See application file for complete search history.

(56) References Cited

U.S. PATENT DOCUMENTS

| | | | | |
|---|---|---|---|---|
| 5,654,762 A * | 8/1997 | Slavin et al. | ......... | 375/240.24 |
| 6,628,215 B2 * | 9/2003 | Talwar et al. | ............... | 341/107 |
| 6,836,525 B1 * | 12/2004 | Weng | ........................ | 377/34 |
| 7,019,673 B2 * | 3/2006 | Blaum et al. | ................. | 341/98 |
| 7,081,838 B2 * | 7/2006 | Hoyer | ....................... | 341/58 |
| 7,106,226 B2 * | 9/2006 | Liu et al. | ...................... | 341/97 |
| 2003/0108142 A1 * | 6/2003 | Hamaguchi | .................. | 377/44 |
| 2006/0066416 A1 * | 3/2006 | Nicholson et al. | ............ | 333/32 |

* cited by examiner

*Primary Examiner*—Linh Nguyen
(74) *Attorney, Agent, or Firm*—Laura C. Hargitt (57) ABSTRACT

Methods, systems and data structures select prioritized robust data values from a plurality of available data values formed by a plurality of data bits, each capable of exhibiting a bit value. Available data values are arranged into a gray code format, and alternate values of gray code format are selected to form a value map. An optional complementary value map may also be formed from the remaining data values. The value map is then prioritized according to bit adjacencies, wherein bit adjacencies are defined by contiguous bits within one of the data values that exhibit a common bit value. Priority may be given to data values having shortest and/or fewest bit adjacencies.

20 Claims, 5 Drawing Sheets

| Decimal Value | Bit 4 | Bit 3 | Bit 2 | Bit 1 | 0s or 1s Pairs | 0s or 1s Threes | 0s or 1s Fours |
|---|---|---|---|---|---|---|---|
| 4 | 0 | 1 | 0 | 0 | 1 | 0 | 0 |
| 11 | 1 | 0 | 1 | 1 | 1 | 0 | 0 |
| 2 | 0 | 0 | 1 | 0 | 1 | 0 | 0 |
| 13 | 1 | 1 | 0 | 1 | 1 | 0 | 0 |
| 8 | 1 | 0 | 0 | 0 | 0 | 1 | 0 |
| 7 | 0 | 1 | 1 | 1 | 0 | 1 | 0 |
| 1 | 0 | 0 | 0 | 1 | 0 | 1 | 0 |
| 14 | 1 | 1 | 1 | 0 | 0 | 1 | 0 |

404

| Decimal Value | Bit 4 | Bit 3 | Bit 2 | Bit 1 | 0s or 1s Pairs | 0s or 1s Threes | 0s or 1s Fours |
|---|---|---|---|---|---|---|---|
| 5 | 0 | 1 | 0 | 1 | 0 | 0 | 0 |
| 10 | 1 | 0 | 1 | 0 | 0 | 0 | 0 |
| 9 | 1 | 0 | 0 | 1 | 1 | 0 | 0 |
| 6 | 0 | 1 | 1 | 0 | 1 | 0 | 0 |
| 12 | 1 | 1 | 0 | 0 | 2 | 0 | 0 |
| 3 | 0 | 0 | 1 | 1 | 2 | 0 | 0 |
| 0 | 0 | 0 | 0 | 0 | 0 | 0 | 1 |
| 15 | 1 | 1 | 1 | 1 | 0 | 0 | 1 |

| Decimal Value | Bit 5 | Bit 4 | Bit 3 | Bit 2 | Bit 1 | 0s or 1s Pairs | 0s or 1s Threes | 0s or 1s Fours | 0s or 1s All |
|---|---|---|---|---|---|---|---|---|---|
| 10 | 0 | 1 | 0 | 1 | 0 | 0 | 0 | 0 | 0 |
| 20 | 1 | 0 | 1 | 0 | 0 | 1 | 0 | 0 | 0 |
| 9 | 0 | 1 | 0 | 0 | 1 | 1 | 0 | 0 | 0 |
| 18 | 1 | 0 | 0 | 1 | 0 | 1 | 0 | 0 | 0 |
| 5 | 0 | 0 | 1 | 0 | 1 | 1 | 0 | 0 | 0 |
| 12 | 0 | 1 | 1 | 0 | 0 | 2 | 0 | 0 | 0 |
| 6 | 0 | 0 | 1 | 1 | 0 | 2 | 0 | 0 | 0 |
| 27 | 1 | 1 | 0 | 1 | 1 | 2 | 0 | 0 | 0 |
| 23 | 1 | 0 | 1 | 1 | 1 | 0 | 1 | 0 | 0 |
| 17 | 1 | 0 | 0 | 0 | 1 | 0 | 1 | 0 | 0 |
| 29 | 1 | 1 | 1 | 0 | 1 | 0 | 1 | 0 | 0 |
| 3 | 0 | 0 | 0 | 1 | 1 | 1 | 1 | 0 | 0 |
| 24 | 1 | 1 | 0 | 0 | 0 | 1 | 1 | 0 | 0 |
| 15 | 0 | 1 | 1 | 1 | 1 | 0 | 0 | 1 | 0 |
| 30 | 1 | 1 | 1 | 1 | 0 | 0 | 0 | 1 | 0 |
| 0 | 0 | 0 | 0 | 0 | 0 | 0 | 0 | 0 | 1 |

PRIORITY

504

| Decimal Value | Bit 5 | Bit 4 | Bit 3 | Bit 2 | Bit 1 | 0s or 1s Pairs | 0s or 1s Threes | 0s or 1s Fours | 0s or 1s All |
|---|---|---|---|---|---|---|---|---|---|
| 21 | 1 | 0 | 1 | 0 | 1 | 0 | 0 | 0 | 0 |
| 11 | 0 | 1 | 0 | 1 | 1 | 1 | 0 | 0 | 0 |
| 22 | 1 | 0 | 1 | 1 | 0 | 1 | 0 | 0 | 0 |
| 13 | 0 | 1 | 1 | 0 | 1 | 1 | 0 | 0 | 0 |
| 26 | 1 | 1 | 0 | 1 | 0 | 1 | 0 | 0 | 0 |
| 19 | 1 | 0 | 0 | 1 | 1 | 2 | 0 | 0 | 0 |
| 25 | 1 | 1 | 0 | 0 | 1 | 2 | 0 | 0 | 0 |
| 4 | 0 | 0 | 1 | 0 | 0 | 2 | 0 | 0 | 0 |
| 8 | 0 | 1 | 0 | 0 | 0 | 0 | 1 | 0 | 0 |
| 14 | 0 | 1 | 1 | 1 | 0 | 0 | 1 | 0 | 0 |
| 2 | 0 | 0 | 0 | 1 | 0 | 0 | 1 | 0 | 0 |
| 7 | 0 | 0 | 1 | 1 | 1 | 1 | 1 | 0 | 0 |
| 28 | 1 | 1 | 1 | 0 | 0 | 1 | 1 | 0 | 0 |
| 16 | 1 | 0 | 0 | 0 | 0 | 0 | 0 | 1 | 0 |
| 1 | 0 | 0 | 0 | 0 | 1 | 0 | 0 | 1 | 0 |
| 31 | 1 | 1 | 1 | 1 | 1 | 0 | 0 | 0 | 1 |

PRIORITY

FIG. 5

METHOD AND SYSTEM FOR PRIORITIZING DATA VALUES FOR ROBUST DATA REPRESENTATION

CROSS-REFERENCES TO RELATED APPLICATIONS

This application claims the benefit of U.S. Provisional Application No. 60/649,851, filed Feb. 2, 2005.

TECHNICAL FIELD

The present invention generally relates to data representation, and more particularly relates to methods and systems for prioritizing values in data maps for robust data representation.

BACKGROUND

Computing devices, particularly those found in various automotive, industrial, aerospace and other commercial settings, commonly represent operating modes or other information with sequences of binary digits or "bits" called "data values". A conventional Karnaugh map, for example, is one technique for generating data values for a given number ("n") bits. Conventional Karnaugh mapping techniques can be used to identify up to $2^n$ data values from the n bits. The resulting values can be stored in memory and/or exchanged with other computing modules to represent operating states or other appropriate information.

As digital data is stored, processed, consumed and/or shared between modules, bit errors can occur due to environmental factors, hardware faults and other causes. To ensure that data values are reliable, computing systems frequently incorporate error checking techniques such as parity checks, cyclic redundancy checks (CRCs) and/or the like. Conventionally, a program module preparing a data message computes a digital verification code based upon the contents of the message using a particular algorithm. The resulting verification code can then be appended to the message during transmission. The receiving module verifies the code using the same algorithm as the transmitting module to ensure that the contents of the message did not change during transmission; that is, by comparing a code computed prior to transmission with a code computed according to the same algorithm after transmission, the contents of the message can be verified to ensure that no bit errors occurred during transmission. Examples of well-known algorithms for computing reliable verification codes include the so-called CRC32 and MD4 algorithms, among others. While error checking routines are highly reliable, they do exhibit several disadvantages in terms of bandwidth and computing resources. Particularly in the vehicle setting, where computing resources and communications bandwidth are limited, the additional space and time required to transmit verification codes can be undesirable.

It is therefore desirable to formulate a data representation scheme that is capable of efficiently representing data without sacrificing robustness or accuracy. Moreover, it is desirable to create a technique for generating data values for such schemes. Furthermore, other desirable features and characteristics will become apparent from the subsequent detailed description and the appended claims, taken in conjunction with the accompanying drawings and the foregoing technical field and background.

BRIEF SUMMARY

According to various exemplary embodiments, methods, systems and data structures select prioritized robust data values from available data values formed by a plurality of data bits that are each capable of exhibiting a bit value. Available data values are arranged into a gray code format, and alternate values of gray code format are selected to form a value map. An optional complementary value map may also be formed from the remaining data values. The value map is then prioritized according to bit adjacencies, wherein bit adjacencies are defined by contiguous bits within one of the data values that exhibit a common bit value. Priority may be given to data values having shortest and/or fewest bit adjacencies.

In various further embodiments, the prioritized data values may be used to represent state data, variable data or the like. By selecting the value map to include only those data values that differ from each other by at least two bit values, susceptibility to bit errors is substantially reduced. That is, any single bit errors are readily identified (e.g. in a complementary value map) from the structure of the value map, thereby reducing the need for separate error-checking structures in many embodiments. Moreover, susceptibility to nibble, byte and/or other data errors can be appropriately reduced by prioritizing data values with shorter and/or fewer bit adjacencies.

BRIEF DESCRIPTION OF THE DRAWINGS

The present invention will hereinafter be described in conjunction with the following drawing figures, wherein like numerals denote like elements, and.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, robust data values are selected to determine the most robust values or sets of values for representing data. By properly choosing the bit sequences used in each data value, bit errors occurring during processing or transmission can be readily identified without the need for additional verification codes or the like. In a system wherein data values represent operating states, for example, data values can be assigned to the various operating states in a manner that requires any state transition to exhibit multiple bit transitions. If a single bit transition does occur due to a hardware fault or other undesirable event, the resulting data value will be immediately recognizable as invalid without the need for further error checking. Similar constraints can be applied to prevent nibble (4-bit), byte (8-bit) or other errors.

The particular data values used may be prioritized and/or selected using the techniques described herein. Generally speaking, data values are prioritized such that those values having the shortest and fewest bit adjacencies are given highest priority. "Bit adjacency" refers to two or more contiguous bits that have the same bit value (e.g. "0" or "1"). Because the most common hardware faults tend to produce errors in single bits or in groups of contiguous bits (particularly four and eight bit groups), avoiding bit adjacencies tends to increase the robustness of the data map. Robustness is also improved by selecting data values that differ from each other by multiple bit values, and/or by imposing other constraints.

Figure 1:
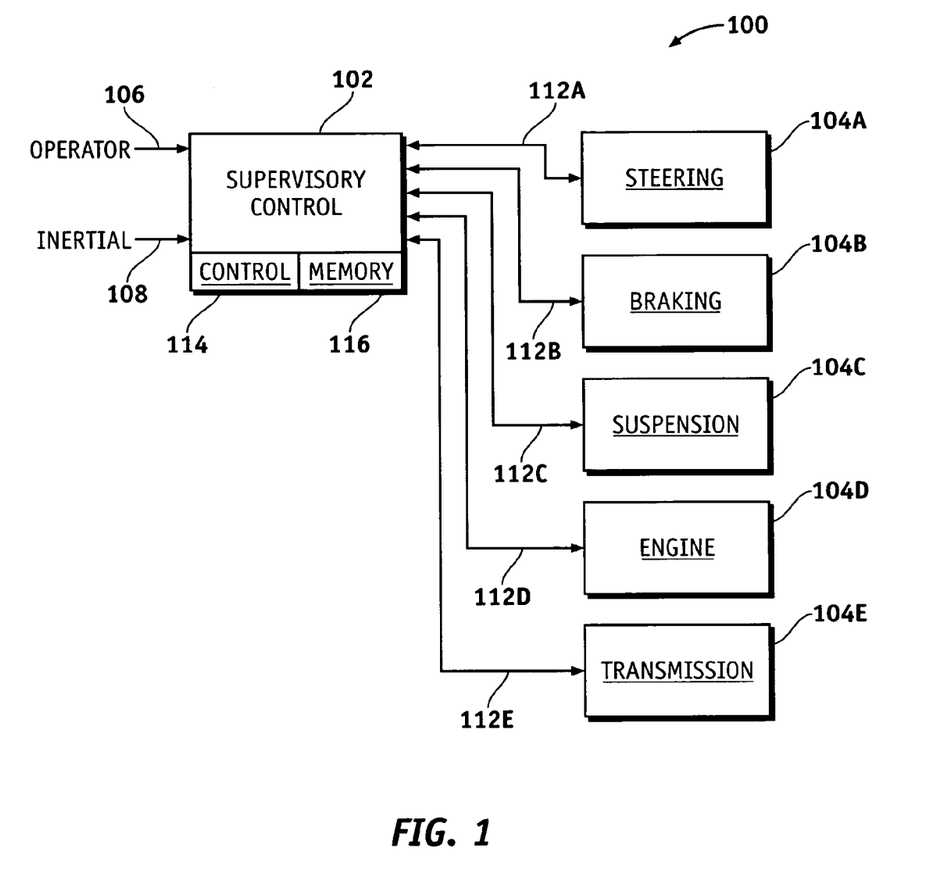
FIG. 1 is a block diagram of an exemplary computing system that includes various processing modules.

The techniques described herein may be applied in any computing context, including any automotive, aerospace, commercial, governmental, industrial or consumer setting. By way of example only, data values could be used to represent operating states used within a control system. To illustrate just one context wherein data values may be used, FIG. 1 shows an exemplary automotive control system 100. System 100 shown in FIG. 1 includes a supervisory controller 102 that communicates with any number of sub-modules 104A–E as appropriate. Control module 102 suitably provides appropriate signals 112A–E to one or more sub-modules 104A–E based upon operator commands 106, sensor data 106, feedback received from modules 104A–E, processed data and/or any other sources. Control module 102 typically executes on any type of processor or other control circuitry 114 having any associated digital memory 116 and other conventional hardware resources as appropriate. Sub-modules 104A–E similarly execute on any type of processing or control hardware, and may variously reside on the same or different hardware as control module 102. To that end, each of the modules 102 and 104 shown in FIG. 1 are intended as logical modules capable of inter-communicating with each other in any manner.

Data communications between control module 102 and sub-modules 104A–E take place in any appropriate manner. Data communications may take place via any serial or parallel data connection, for example, or across any conventional wired or wireless data link. Alternatively, signals 112A–E may represent signals passed internally within a processor, controller or other component. In embodiments wherein one or more sub-modules 104A–E reside on the same hardware as control module 102, for example, signals 112A–E may represent data structures formed in memory 116 and/or processed by controller 114. Signals 112A–E (or any subset thereof) may also be provided to or from other components (e.g. sensors, displays, other controllers, etc.) as appropriate.

Data signals 112A–E may be electrically and/or logically formatted in any appropriate manner. In an exemplary embodiment, signals 112A–E are capable of transporting a data structure that represents various operating states of system 100 and/or various sub-modules 104A–E. Through proper selection and assignment of binary digit ("bit") values used to represent the various operating modes, any errors occurring during processing or transmission of signals 112A–E can be readily identified within the data structure, as described more fully below. Again, FIG. 1 is simply one example of an environment wherein data values may be used. Other equivalent embodiments may use any number of modules 102, 104 arranged in any fashion and communicating in any manner.

Figure 2:
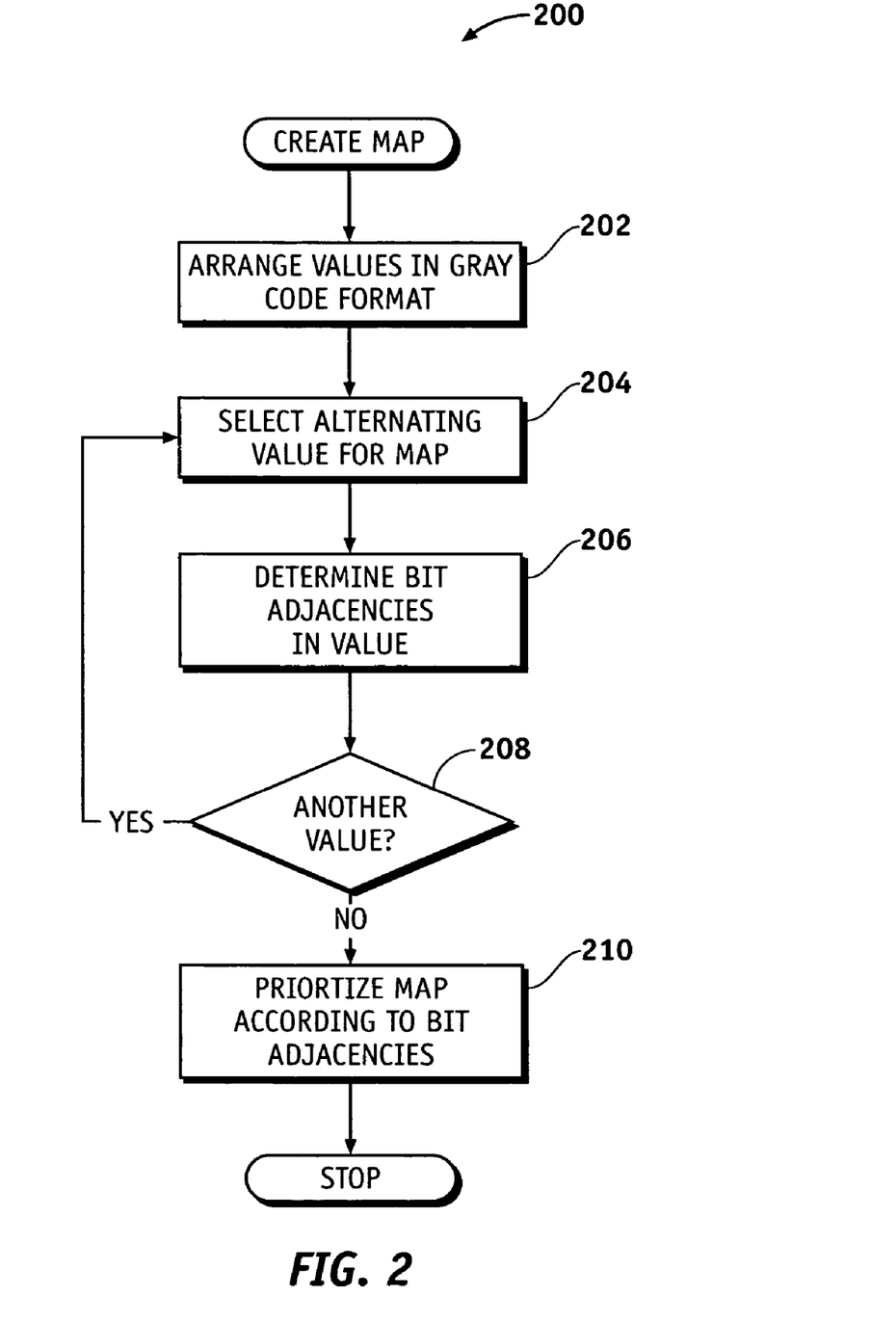
FIG. 2 is a flowchart of an exemplary process for creating robust data maps.

Referring now to FIG. 2, an exemplary process 200 for creating robust data value maps suitably includes the broad steps of arranging the values available in a gray code format (step 202), selecting alternate values for a value map and/or complementary value map (step 204), determining bit adjacencies for each value in the map (step 206), and prioritizing the values within the map according to the size and number of bit adjacencies present in each value (step 210). Process 200 may be executed manually and/or in any automated manner, such as using a digital computer. In the latter case, some or all of the steps in process 200 may be executed by instructions stored in a digital memory (e.g. memory 116 in FIG. 2) or other storage medium. The various steps shown in FIG. 2 may be logically or temporally arranged in any manner, any need not execute according to the particular logic shown in the figure. Moreover, the various steps shown may be combined, supplemented or modified in any manner.

According to the exemplary embodiment of process 200 shown in FIG. 2, each of the available data values are initially listed in gray code format (step 202). The "available" values are suitably dependent upon the number of bits available, as described more fully below. Three conventional data bits, for example, are capable of representing eight data values ("000", "001", "010", "011", "100", "101", "110" and "111"), with additional bits providing additional available values.

Process 200 begins by arranging or otherwise organizing available values into gray code format (step 202). The ordering may be executed manually, with a computer spreadsheet or other program, or in any other appropriate manner. "Gray code" refers to an ordered list of values organized such that only one bit changes from one value to the subsequent value in the list. Exemplary gray code sequences for three eight three-bit values described above include <000, 001, 011, 010, 110, 111, 101, 100> and <000, 010, 011, 001, 101, 111, 110, 100>. Accordingly, many value lists may be placed into any of several gray code formats. Further, the gray code sequences need not start with an "all-zero" or "all-one" state, but may be initiated with any value.

Alternating gray code values are then selected to create a map of robust values that can be used to represent state information or other data (step 204). Because gray code values differ from each other by a single bit transition, alternating gray code values can be expected to differ from each other by at least two bit transitions, thereby creating robustness in the various states. In a further optional embodiment, step 204 involves creating two separate maps of robust values from the gray coded sequence (e.g. by placing the even numbered values into one map and odd numbered values in a separate map). Each of the two maps created in this manner suitably represent complementary invalid states of the other map; that is, states that are valid in one map are invalid in the other map, and vice versa. This concept is explored more fully below.

Continuing with the exemplary process 200 shown in FIG. 2, the value map created in step 202 is appropriately evaluated to determine the most desirable values used to represent state data. Typically, the states that are least susceptible to bit, nibble, byte or other errors are identified as the priority values for use in actual data structures. Undetectable bit, nibble and byte errors are most likely to occur in values with sequences of contiguous bits having the same value. That is, hardware faults tend to create contiguous sequences of identical bits, making such faults harder to detect if the values used to represent actual data have similarly long contiguous sequences of identical values.

Accordingly, one technique for prioritizing robust states involves identifying bit adjacencies in each potential value, and giving priority to those values with shortest and/or fewest bit adjacencies. As shown in FIG. 2, this may be accomplished by manually or automatically determining the number and type of bit adjacencies (step 206) for each value present in the map (step 208). Although FIG. 2 shows steps 206 and 208 as executing while the map is being created from alternate gray code values, in practice step 206 may be executed at any point in process 200. The determination and arranging functions of step 206 and 210, for example, could be combined in an equivalent embodiment.

The value map is manually or automatically sorted or otherwise prioritized in any appropriate manner (step 210). In an exemplary embodiment, values with the shortest bit adjacencies are given highest priority, with the number of bit adjacencies also taken into consideration. In this manner, values with unlike adjacent bits are given higher priority in the map than values with similar adjacent bits. Those values with no bit adjacencies, for example, will be given highest priority, followed by values with only two-bit adjacencies. Of those values having two-bit adjacencies, those with the fewest number of adjacencies may be given higher priority than those values with more adjacencies. If the value map includes values with three-bit or larger adjacencies, priority is next given to values having only one three-bit adjacency, followed by combinations of two and three-bit adjacencies. For value map of n bits, adjacencies having lengths from two bits to n–1 bits in length are appropriately considered, with values having longer bit adjacencies generally receiving lower priority.

Although values having equal numbers of longer adjacencies may be prioritized according to the number or frequency of smaller adjacencies also present in the data value (e.g. with values having fewer smaller adjacencies having priority over values with more frequent smaller adjacencies), priority is appropriately given to adjacency size before adjacency frequency. That is, a value with a single three-bit adjacency and multiple two-bit adjacencies would have priority over a value having multiple three-bit adjacencies.

Because the techniques described herein may be applicable across a wide range of computing systems and environments, the particular prioritization routine used may vary significantly from embodiment to embodiment. Although longer bit adjacencies are typically given lower priority in the examples herein, for example, other processes 200 may actually grant higher priority to values with bit adjacencies, and/or may differently prioritize bit values according to increasing or decreasing bit size and/or frequency. Alternate embodiments may therefore use other sorting or prioritization techniques without departing from the concepts set forth herein.

Figure 3:
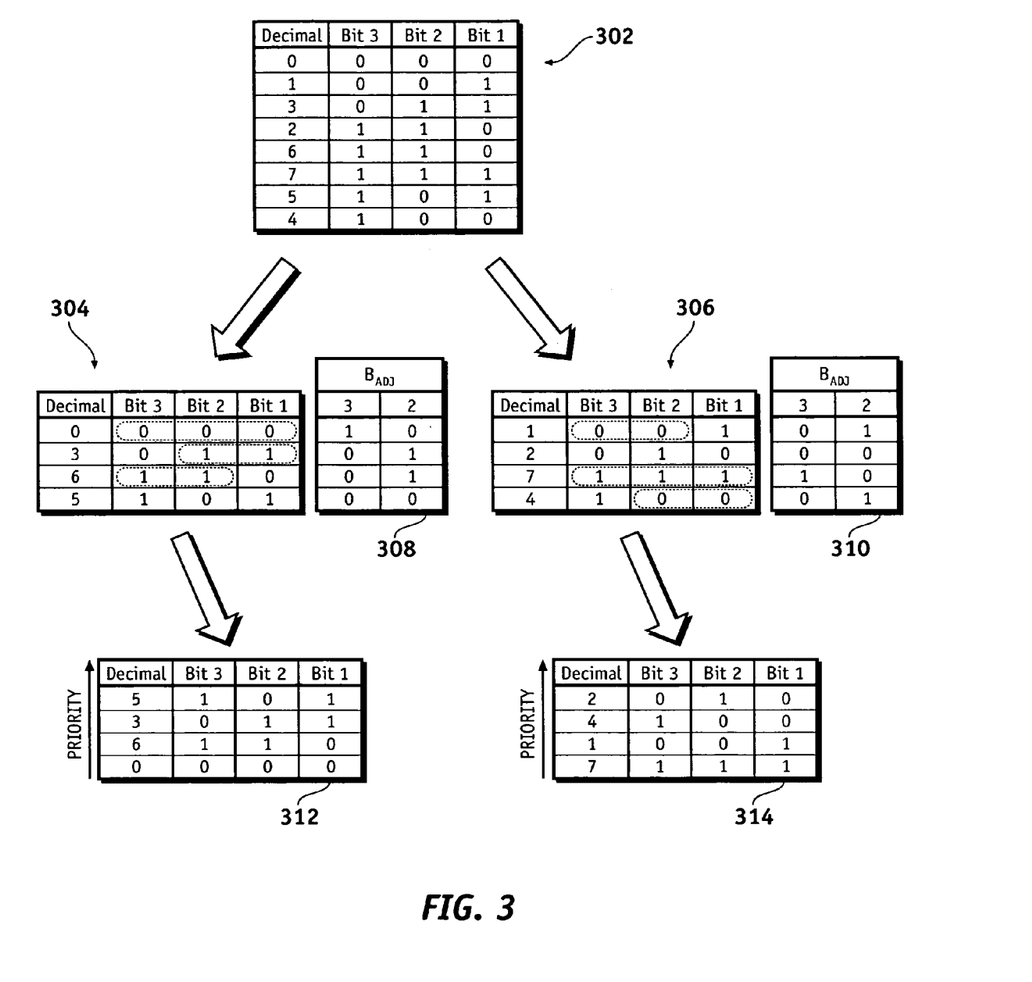
FIG. 3 is diagram showing the evolution of an exemplary prioritized data map.

The evolution of an exemplary set of prioritized and robust data maps 312 and 314 is shown in FIG. 3. These concepts of sorting and prioritization may be readily applied to any number of values formed from bit streams of any size. That is, the concepts set forth in process 200 and in FIG. 3 could be used to create priority maps representing values having any length, including values of tens, hundreds or even more bits. Various additional concepts for handling very large value maps are described more fully below.

Value map 302 shows an exemplary sequence of three bit values in gray code form. Map 302 shown in FIG. 3 also includes a decimal equivalent for each binary value, although this equivalent is provided simply for ease of understanding and reference, and may not be present in all embodiments. Placing alternate values into separate sets results in two complementary maps 304 and 306, with values in each map representing invalid states of the other map. That is, each of the values that are valid within map 304 (e.g. decimal values 0, 3, 6 and 5) would be invalid in systems based upon map 306, and vice versa.

The number of bit adjacencies present in each value listed in maps 304 and 306 are shown in tables 308 and 310, respectively. Decimal value "0" in map 304, for example, has a single three-bit adjacency, whereas values "3" and "6" each have one two-bit adjacency, and value "5" has no bit adjacencies. Similarly, value "7" in map 306 has a single three-bit adjacency, and values "1" and "4" have single two-bit adjacencies.

Using the preference scheme described above in conjunction with FIG. 2, the resulting maps 312 and 314 present the various robust values in a manner that gives preference to those values having smaller and fewer bit adjacencies. Values "5" and "2" are therefore shown with highest priority, since these two states have no bit adjacencies. Values "3" and "6" in map 312 and values "4" and "1" in map 314 are next in priority, with values "0" and "7" having the lowest priority due to the three-bit adjacency present in each of these values. In the exemplary embodiment of FIG. 3, no preference is given to whether the adjacent bits are set to "0" or "1". That is, adjacent "0" bits are considered in the same manner as adjacent "1" bits. Alternate embodiments, however, may give preference to either bit value. In embodiments wherein data structures are initialized to an "all-zero" form, for example, preference may be given to "0" states over "1" states, since "0" states less likely to result from bit errors. Conversely, embodiments initialized to an "all-one" form may give preference to "1" values. Further, values "3" and "6" in map 312 may be exchanged with each other without affecting priority, since each of these values exhibits a single two-bit adjacency. Values "4" and "1" in table 314 could be similarly exchanged. Other factors may also be considered in establishing value priority.

Value maps 312 and 314 therefore present two complementary lists of values suitable for representing operating states or other information within computing system 100 (FIG. 1). The values shown closer to the top of maps 312 and 314 generally exhibit the least susceptibility to bit errors, and may therefore be the most preferable for use in representing state data or other information within system 100. Stated another way, maps 312 and 314 show the highest-priority data values for certain applications arranged closest to the top of the maps. Similarly, values toward the bottom of the maps generally represent values with more bit adjacencies than those values shown higher in the map; these states therefore exhibit reduced immunity to bit, nibble and/or byte faults in certain applications, and can be said to have a "lower priority" for use in representing state data or other information in those applications.

Nevertheless, each of the values contained within each map 312 and 314 are robust with respect to each other; that is, any transition from one value to another valid value requires at change in the state of at least two bits. As a result, no single bit error (or any nibble or byte error) in a valid value could produce another valid value within the map, thereby providing improved robustness against such errors. Further, because the two maps 312 and 314 are complementary to each other, the values in each map represent states that are invalid according to the other map. That is, the various states in map 314 represent invalid operating states for map 312, and vice versa. By checking received or processed data values against values maintained in the complementary map, then, a processing module or device may readily identify any inaccuracies in the data. That is, the complementary map may be used in some embodiments to identify errors or other issues in received or processed data.

The various data values may be transmitted or processed in any manner. In an exemplary embodiment, a data structure is formulated by a program or device to use one or more values within a value map to represent state data or the like. This data structure may then be processed, stored and/or transmitted to a receiving program, device or other module as appropriate.

Figure 4:
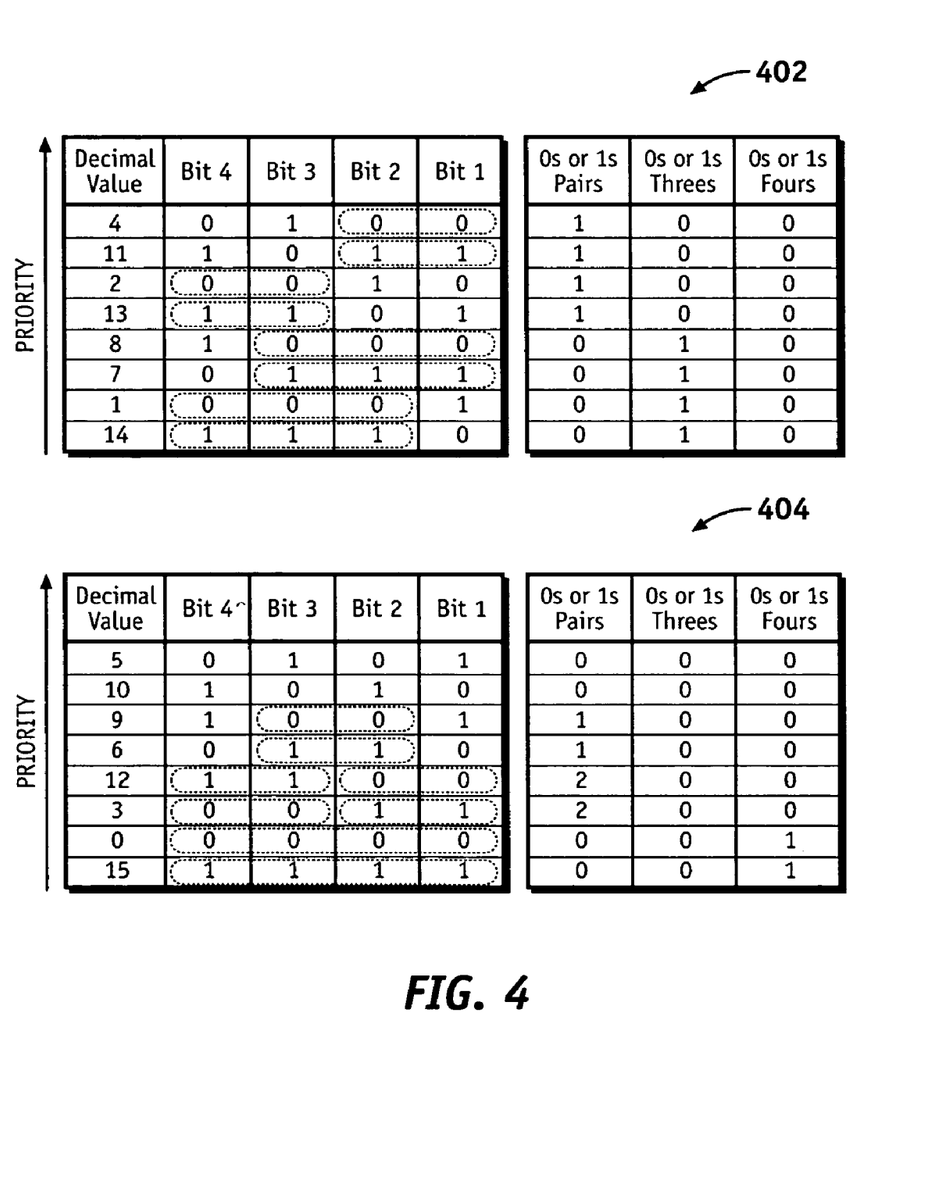
FIG. 4 shows exemplary prioritized data maps of robust four-bit values.
Figure 5:
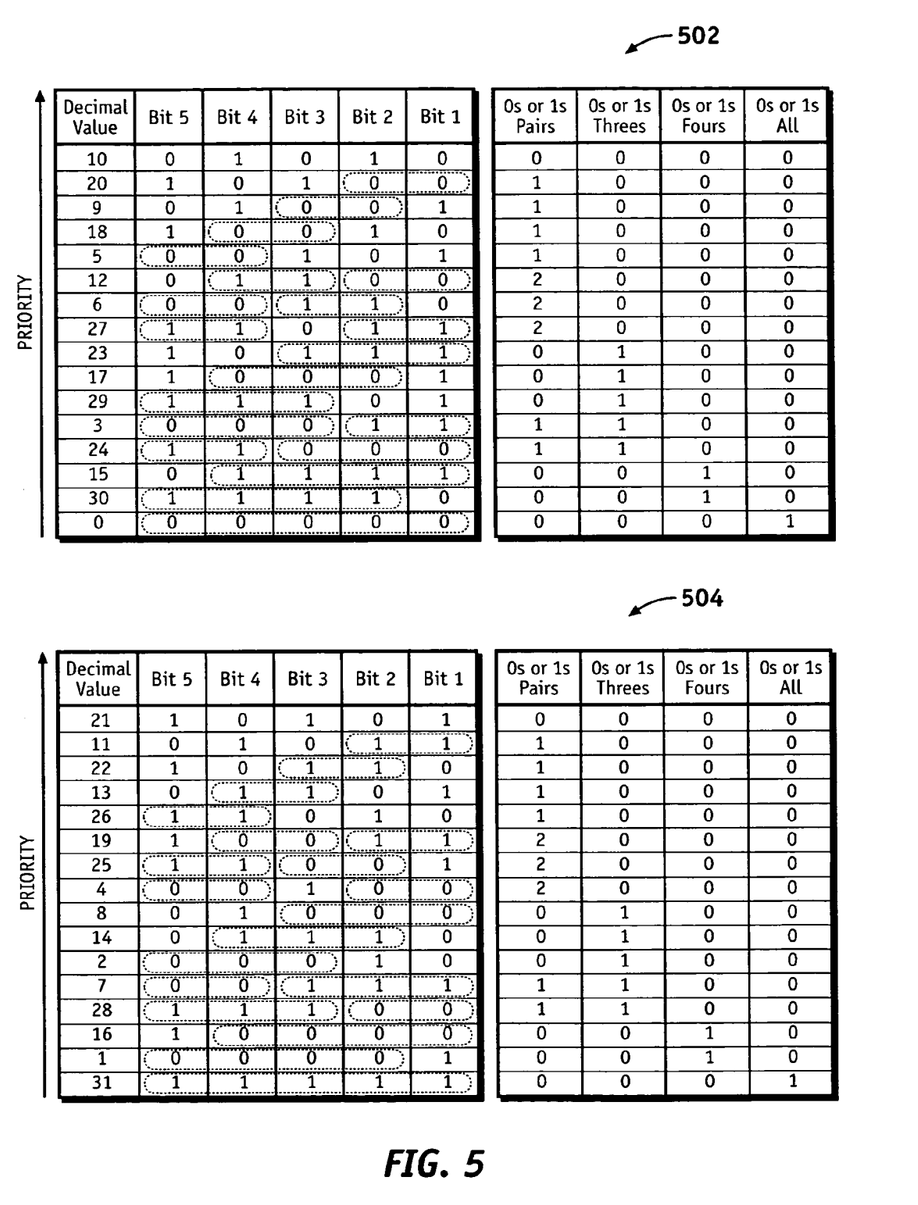
FIG. 5 shows exemplary prioritized data maps of robust five-bit values.

Again, the concepts shown in FIG. 3 with respect to three-bit maps could be applied to larger maps having any number of bits. FIGS. 4 and 5, for example, show exemplary value maps formulated according to the above-described techniques as applied to four and five bit values, respectively. FIG. 4 therefore presents two complementary maps 402 and 404 suitable for representing up to eight robust data states, and FIG. 5 presents complementary maps 502 and 504 suitable for representing as many as sixteen robust data states. Equivalent maps could be generated for values having six or more bits using the concepts set forth above.

Larger bit streams may be subdivided into two or more sub-sections of any length in various further embodiments. A conventional twelve-bit data sequence, for example, is typically capable of representing up to 4096 (equal to $2^{12}$) non-robust states or 2048 ($2^{12-1}$) robust values. The 4096 non-robust states could be equivalently represented with thirteen-bit robust data values (with the additional bit providing additional states used for robustness), or by dividing the twelve-bit variable into multiple robust portions. Twelve bits could be divided into three four-bit portions, for example, with each portion represented by a five-bit robust map such as that shown in FIG. 5 above. Alternatively, the twelve bits could be divided into four three-bit portions, with each non-robust three-bit portion represented by a robust four-bit robust map such as that shown in FIG. 4 above. Other options include representing only a portion of the variable with robust data values. A twelve-bit non-robust variable, for example, could be represented by separating the twelve-bits into a three-bit portion and a nine-bit portion. A robust ten-bit map (capable of representing up to 512 robust states) could then be used to represent the most significant nine bit portion, and conventional non-robust data could represent the three remaining bits.

Further, the various representation techniques may be combined in any manner. A twelve-bit non-robust variable could be represented with three non-robust bits, for example, with the remaining nine bits subdivided into a five-bit and a four-bit portion that could be represented with robust maps of six and five bits, respectively. When variables are divided into multiple sections, various embodiments further select data values that avoid bit adjacencies between sections. This may be accomplished, for example, by excluding values that have bit adjacencies in the outermost bits that may abut against similar adjacencies in other data sections, thereby creating larger adjacencies that could be relatively more difficult to differentiate from nibble or byte faults. Again, the particular data representation schemes and value assignments may vary significantly from embodiment to embodiment.

Using the various techniques and systems described above, various benefits may be achieved. Robust data values as described herein provide improved resistance to bit, nibble and/or byte errors, for example, in a relatively space-efficient manner, thereby providing an effective balance between throughput and security for many applications. Although the various embodiments are most frequently described with respect to automotive applications, the invention is not so limited. Indeed, the concepts, systems and structures described herein could be readily applied in any transportation, aeronautical, governmental, industrial, commercial or other setting.

While at least one exemplary embodiment has been presented in the foregoing detailed description, a vast number of variations exist. The exemplary embodiments described herein are intended only as examples, and are not intended to limit the scope, applicability, or configuration of the invention in any way. Rather, the foregoing detailed description will provide those skilled in the art with a convenient road map for implementing one or more exemplary embodiments. Various changes can therefore be made in the functions and arrangements of elements set forth herein without departing from the scope of the invention as set forth in the appended claims and the legal equivalents thereof.

What is claimed is:

1. A method for selecting prioritized data values from a plurality of available data values formed by a plurality of data bits, wherein each of the data bits exhibits a bit value, the method comprising the steps of:
   arranging the plurality of available data values in a gray code format;
   selecting alternate data values of the gray code format for a value map; and
   prioritizing the value map according to bit adjacencies, wherein bit adjacencies are defined by contiguous bits within one of the data values that each exhibit a common bit value.

2. The method of claim 1 wherein the prioritizing step comprises determining a size of bit adjacencies in each of the data values in the value map.

3. The method of claim 2 wherein the prioritizing step further comprises determining a frequency of bit adjacencies in each of the data values in the value map.

4. The method of claim 3 wherein the prioritizing step further comprises sorting the value map primarily according to the size of bit adjacencies, and secondarily according to the frequency of bit adjacencies.

5. The method of claim 1 wherein each of the data values in the value map are arranged such that any transition from one data value to another data value in the value map requires a change in the bit values of at least two of the plurality of data bits.

6. The method of claim 1 wherein the data values of the gray code format not selected for the value map are selected for a complementary value map.

7. The method of claim 6 wherein the data values in the complementary value map comprise invalid states of the value map.

8. The method of claim 1 wherein the plurality of bits comprises at least two bits.

9. The method of claim 1 further comprising the step of dividing the plurality of available data values into a first section and a second section, each of the sections corresponding to a separate value map.

10. The method of claim 1 further comprising the step of selecting at least a portion of the data values in the value map having the highest priority to represent state information.

11. The method of claim 1 wherein the plurality of bits comprise an even number of bits.

12. The method of claim 11 wherein the value map comprises a first data value wherein each of the plurality of bits comprise a first bit value and a second data value wherein each of the plurality of bits comprise a second bit value different from the first bit value.

13. The method of claim 1 wherein the plurality of data bits comprises n data bits, and wherein the prioritization step comprises identifying bit adjacencies of lengths ranging from two bits to n−1 bits.

14. The method of claim 13 wherein the prioritization step further comprises sorting the data values according to the length of the longest bit adjacencies found within each data value.

15. The method of claim 14 wherein the prioritization step comprises further sorting data values having longest bit adjacencies of equal lengths according to frequency of bit adjacencies.

16. A system for selecting prioritized data values from a plurality of available data values formed by a plurality of data bits, wherein each of the data bits exhibits a bit value, the system comprising:
    means for arranging the plurality of available data values in a gray code format;
    means for selecting alternate data values of the gray code format for a value map; and
    means for prioritizing the value map according to bit adjacencies, wherein bit adjacencies are defined by contiguous bits within one of the data values that each exhibit a common bit value.

17. The system of claim 16 wherein each of the data values in the value map are arranged such that any transition from one data value to another data value in the value map results from a change in the bit values of at least two of the plurality of data bits.

18. A value map for representing state information with a plurality of data bits, wherein each of the data bits exhibits a bit value, the value map comprising a plurality of data values formed from the plurality of data bits, wherein each of the data values in the data map are arranged such that any transition from one data value to another data value in the value map results from a change in the bit values of at least two of the plurality of data bits.

19. The value map of claim 18 wherein the value map is further prioritized according to bit adjacencies, wherein bit adjacencies are defined by contiguous bits within one of the data values exhibiting a common bit value.

20. A digital storage medium having computer-readable instructions stored thereon, wherein the instructions comprise the data map of claim 18.

* * * * *